United States Patent
Lee et al.

(10) Patent No.: US 7,791,137 B2
(45) Date of Patent: Sep. 7, 2010

(54) HIGH VOLTAGE METAL OXIDE SEMICONDUCTOR DEVICE

(75) Inventors: Chih-Hua Lee, Hsinchu (TW); Ming-I Chen, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 466 days.

(21) Appl. No.: 11/669,951

(22) Filed: Feb. 1, 2007

(65) Prior Publication Data
US 2007/0128788 A1    Jun. 7, 2007

Related U.S. Application Data

(62) Division of application No. 11/163,219, filed on Oct. 11, 2005, now Pat. No. 7,375,408.

(51) Int. Cl.
*H01L 29/78* (2006.01)
(52) U.S. Cl. .................. 257/335; 257/E21.417
(58) Field of Classification Search .......... 257/335, 257/E21.417
See application file for complete search history.

(56) References Cited

U.S. PATENT DOCUMENTS

| 5,171,699 | A | * | 12/1992 | Hutter et al. | 438/206 |
| 5,306,652 | A | * | 4/1994 | Kwon et al. | 438/283 |
| 5,517,046 | A | * | 5/1996 | Hsing et al. | 257/336 |
| 5,539,238 | A | | 7/1996 | Malhi | |
| 6,265,752 | B1 | | 7/2001 | Liu et al. | |
| 2001/0025961 | A1 | * | 10/2001 | Nakamura et al. | 257/107 |
| 2002/0063266 | A1 | * | 5/2002 | Lee | 257/200 |

* cited by examiner

*Primary Examiner*—Jerome Jackson, Jr.
*Assistant Examiner*—Paul A Budd
(74) *Attorney, Agent, or Firm*—Jianq Chyun IP Office

(57) ABSTRACT

A high voltage metal oxide semiconductor device including a substrate, an N-type epitaxial layer, an isolation structure, a gate dielectric layer, a gate, an N-type drain region, a P-type well, an N-type source region, a first N-type well and a buried N-doped region is provided. The first N-type well is disposed in the N-type epitaxial layer under the isolation structure and on one side of the gate. The first N-type well overlaps with the N-type drain region. The buried N-doped region is disposed in the substrate under the N-type epitaxial layer and connected to the first N-type well.

8 Claims, 6 Drawing Sheets

US 7,791,137 B2

HIGH VOLTAGE METAL OXIDE SEMICONDUCTOR DEVICE

CROSS-REFERENCE TO RELATED APPLICATION

This is a divisional application of patent application Ser. No. 11/163,219, filed on Oct. 11, 2005. The entirety of the above-mentioned patent application is hereby incorporated by reference herein and made a part of this specification.

BACKGROUND OF THE INVENTION

1. Field of the Invention

The present invention relates to a semiconductor device. More particularly, the present invention relates to a high voltage metal oxide semiconductor device.

2. Description of the Related Art

As the dimension of metal oxide semiconductor device continues to shrink, the resulting shorter channel length leads to an increase in the operating speed of the transistor. However, other problems related to the shorter channel grouped under the so-called 'short channel effect' intensify. If the applied voltage remains unchanged but the transistor channel length is reduced, the energy of the electrons inside the channel will increase due to the acceleration by the electric field according to the basic formula: electric field=voltage/length. As a result, the chance of electrical breakdown will increase. Furthermore, the increase in the intensity of the electric field will also lead to an increase in the energy of the electrons within the channel and ultimately result in an electrical breakdown.

In high power devices, double-diffused metal oxide semiconductor (DMOS) is an important device capable of handling high input voltage. In general, the DMOS device can be categorized into lateral double-diffused MOS (LDMOS) and vertical double-diffused MOS (VDMOS).

FIG. 1 is a schematic cross-sectional view of a conventional LDMOS. As shown in FIG. 1, the LDMOS device mainly comprises a substrate 100, a field oxide layer 102, a gate dielectric layer 104, a gate 106, an N-type drift region 108, an N-type drain region 110, a P-type well 112 and an N-type source region 114. The substrate 100 is an N-type substrate (or a P-type substrate). The field oxide layer 102 is disposed in the substrate 100. The gate dielectric layer 104 is disposed in the substrate 100 adjacent to the field oxide layer 102. The gate 106 is disposed on the gate dielectric layer 104 and a portion of the field oxide layer 102. The N-type drift region 108 is disposed in the substrate 100 under the field oxide layer 102. The N-type drain region 110 is disposed in the substrate 100 on one side of the gate 106 close to the field oxide layer 102. The P-type well 112 is disposed in the substrate 100 on another side of the gate 106. The N-type source region 114 is disposed in the P-type well 112.

To meet the demand in high voltage applications, the N-type drain region 108 of the LDMOS device is doped lightly to reduce dopant concentration. However, this method has limited capacity for increasing the operating voltage. Moreover, the driving current will be reduced as well.

FIG. 2 is a schematic cross-sectional view of a conventional VDMOS device. As shown in FIG. 2, the VDMOS device mainly comprises a substrate 200, an N-type epitaxial layer 202, a gate dielectric layer 204, a gate 206, an N-type source region 208, a P-type well 210 and an insulating layer 212. The substrate 200 is an N-type substrate. The N-type epitaxial layer 202 is disposed on the substrate 200. The gate dielectric layer 204 is disposed on the N-type epitaxial layer 202. The gate 206 is disposed on the gate dielectric layer 204. The N-type source region 208 is disposed in the P-type well 210 on each side of the gate 206. The insulating layer 212 covers the gate 206.

In the VDMOS device, the variation in the equipotential between neighboring P-type wells 210 is rather large. Hence, the breakdown voltage of the VDMOS device will be reduced. In fact, the highest operating voltage is in the vicinity between 60~100V, which is a significant limitation on power applications requiring a high operating voltage.

The conventional DMOS device, whether it is a LDMOS or a VDMOS device, has limited capacity for increasing its breakdown voltage. Furthermore, the high ON-resistance ($R_{ON}$) of a conventional DMOS device is also a significant problem waiting to be resolved.

SUMMARY OF THE INVENTION

Accordingly, at least one objective of the present invention is to provide a high voltage metal oxide semiconductor (MOS) device having a lower on-resistance.

At least another objective of the present invention is to provide a method of fabricating a high voltage metal oxide semiconductor (MOS) device having a high breakdown voltage.

To achieve these and other advantages and in accordance with the purpose of the invention, as embodied and broadly described herein, the invention provides a high voltage metal oxide semiconductor (MOS) device. The high voltage MOS device comprises a substrate, an N-type epitaxial layer, an isolation layer, a gate dielectric layer, a gate, an N-type drain region, a P-type well, an N-type source region, a first N-type well and a buried N-doped region. The N-type epitaxial layer is disposed on the substrate. The isolation structure is disposed in the N-type epitaxial layer. The gate dielectric layer is disposed on the N-type epitaxial layer adjacent to the isolation structure. The gate is disposed on the gate dielectric layer and a portion of the isolation structure. The N-type drain region is disposed in the N-type epitaxial layer on that side of the gate close to the isolation structure. The P-type well region is disposed in the N-type epitaxial layer on another side of the gate. The N-type source region is disposed in the P-type well. The first N-type well is disposed in the N-type epitaxial layer under the isolation structure on one side of the gate. Furthermore, the first N-type well and the N-type drain region have some overlapping area. The buried N-doped region is disposed in the substrate under the N-type epitaxial layer and is connected to the first N-type well.

According to one preferred embodiment of the present invention, the aforementioned high voltage MOS device further includes an N-type drift region disposed in the N-type epitaxial layer under the isolation structure.

According to one preferred embodiment of the present invention, the N-type drift region of the high voltage MOS device has a dopant concentration greater than the first N-type well.

According to one preferred embodiment of the present invention, the aforementioned high voltage MOS device further includes a second N-type well disposed in the N-type epitaxial layer on that side of the gate close to the isolation structure and is connected to the buried N-doped region. Furthermore, the second N-type well and the N-type drain region have some overlapping area.

According to one preferred embodiment of the present invention, the second N-type well of the high voltage MOS device has a dopant concentration greater than the N-type drift region. Furthermore, the N-type drift region has a dopant concentration greater than the first N-type well.

According to one preferred embodiment of the present invention, the aforementioned high voltage MOS device further includes a second N-type well disposed in the N-type epitaxial layer on that side of the gate close to the isolation structure and is connected to the buried N-doped region. Furthermore, the second N-type well and the N-type drain region have some overlapping area.

According to one preferred embodiment of the present invention, the second N-type well of the high voltage MOS device has a dopant concentration greater than the first N-type well.

According to one preferred embodiment of the present invention, the isolation structure of the high voltage MOS device includes a field oxide layer.

The present invention also provides a method of fabricating a high pressure metal oxide semiconductor (MOS) device. First, a substrate is provided. Then, a buried N-doped region is formed in the substrate. Thereafter, an N-type epitaxial layer is formed on the substrate. A first N-type well is formed in the N-type epitaxial layer such that the first N-type well is connected to the buried N-doped region. After that, an isolation structure is formed in the first N-type well. Then, a gate dielectric layer is formed on the N-type epitaxial layer. Thereafter, a gate is formed over the gate dielectric layer and a portion of the isolation structure. Furthermore, a P-type well is formed in the N-type epitaxial layer under a portion of the gate and on that side of the gate away from the isolation structure. Then, an N-type drain region is formed in the N-type epitaxial layer on that side of the gate close to the isolation structure. Finally, an N-type source region is formed in the P-type well.

According to the aforementioned method of fabricating the high voltage MOS device in one preferred embodiment of the present invention, the method further includes forming an N-type drift region in the N-type epitaxial layer under the isolation structure.

According to the aforementioned method of fabricating the high voltage MOS device in one preferred embodiment of the present invention, the N-type drift region has a dopant concentration greater than the first N-type well.

According to the aforementioned method of fabricating the high voltage MOS device in one preferred embodiment of the present invention, the method further includes forming a second N-type well in the N-type epitaxial layer on that side of the gate close to the isolation structure. The second N-type well is connected to the buried N-doped region. Furthermore, the second N-type well and the N-type drain region have some overlapping area.

According to the aforementioned method of fabricating the high voltage MOS device in one preferred embodiment of the present invention, the second N-type well has a dopant concentration greater than the N-type drift region and the N-type drift region has a dopant concentration greater than the first N-type well.

According to the aforementioned method of fabricating the high voltage MOS device in one preferred embodiment of the present invention, the method further includes forming a second N-type well in the N-type epitaxial layer on that side of the gate close to the isolation structure. The second N-type well is connected to the buried N-doped region. Furthermore, the second N-type well and the N-type drain region have some overlapping area.

According to the aforementioned method of fabricating the high voltage MOS device in one preferred embodiment of the present invention, the second N-type well has a dopant concentration greater than the first N-type well.

According to the aforementioned method of fabricating the high voltage MOS device in one preferred embodiment of the present invention, the P-type well is formed before the gate or the P-type well is formed after the gate.

According to the aforementioned method of fabricating the high voltage MOS device in one preferred embodiment of the present invention, the isolation structure includes a field oxide layer.

According to the aforementioned method of fabricating the high voltage MOS device in one preferred embodiment of the present invention, the method of forming the field oxide layer includes performing a thermal oxidation.

Because the high voltage MOS device of the present invention has a buried N-doped region and various N-type regions with different dopant concentrations, the breakdown voltage can be increased.

On the other hand, the buried N-doped region and the various N-type regions with different dopant concentrations can provide the electric charges with a greater number of more flow-paths so that the on-resistance can be reduced.

Furthermore, the method of fabricating the high voltage MOS device according to the present invention can be combined with existing bipolar-CMOS-DMOS process (or BCD process). Since there is no need to fabricated additional mask just to form the high voltage MOS device structure of the present invention, no additional production cost is incurred.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
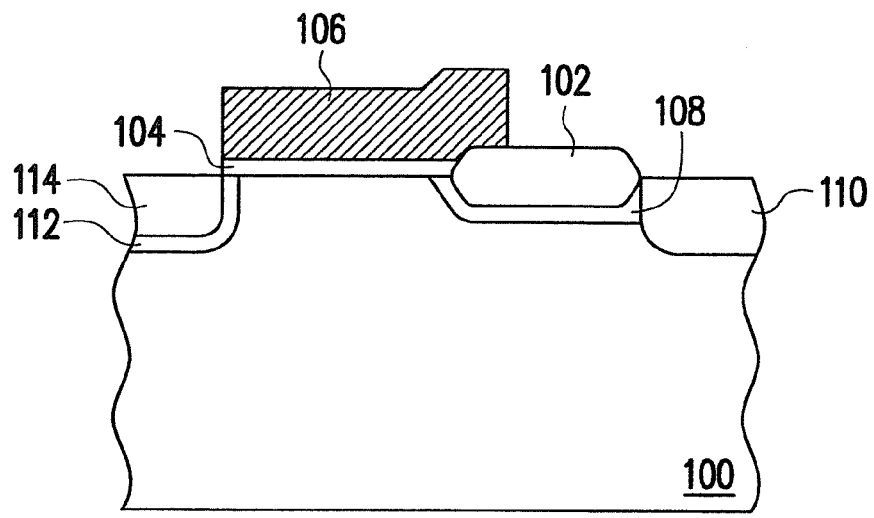
FIG. 1 is a schematic cross-sectional view of a conventional LDMOS.
Figure 2:
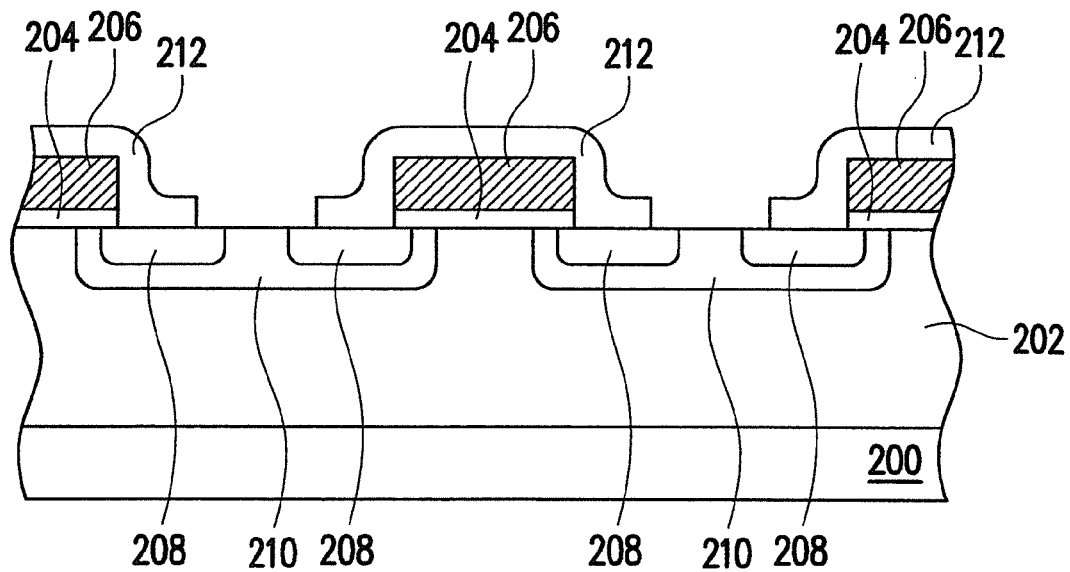
FIG. 2 is a schematic cross-sectional view of a conventional VDMOS device.

Reference will now be made in detail to the present preferred embodiments of the invention, examples of which are illustrated in the accompanying drawings. Wherever possible, the same reference numbers are used in the drawings and the description to refer to the same or like parts.

Figure 3A:
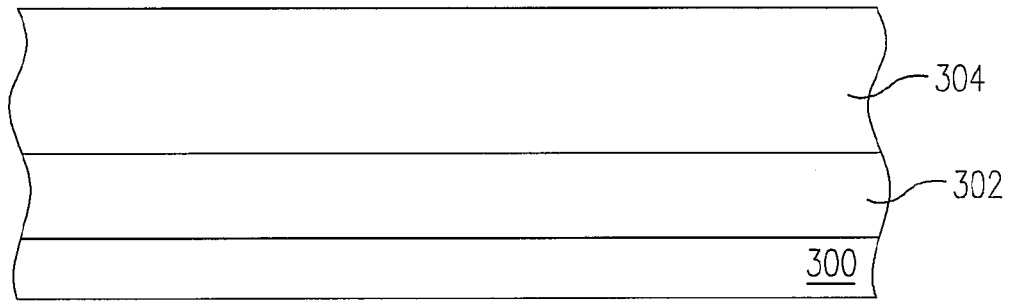
FIGS. 3A through 3D are schematic cross-sectional views showing the steps for fabricating a MOS transistor device according to one preferred embodiment of the present invention.

FIGS. 3A through 3D are schematic cross-sectional views showing the steps for fabricating a MOS transistor device according to one preferred embodiment of the present invention. As shown in FIG. 3A, a substrate 300 is provided. The substrate 300 is an N-type silicon substrate, for example.

Then, a buried N-doped region 302 is formed in the substrate 300. The method of forming the buried N-doped region 302 includes performing an ion implant process using phosphorus as the dopants, for example.

Thereafter, an N-type epitaxial layer 304 is formed over the substrate 300. The N-type epitaxial layer 304 is formed, for example, by performing a chemical vapor deposition process with in-situ implant of phosphorus dopants to form an amorphous silicon material layer (not shown) and performing an solid phase epitaxial process on the amorphous silicon material layer thereafter.

Figure 3B:
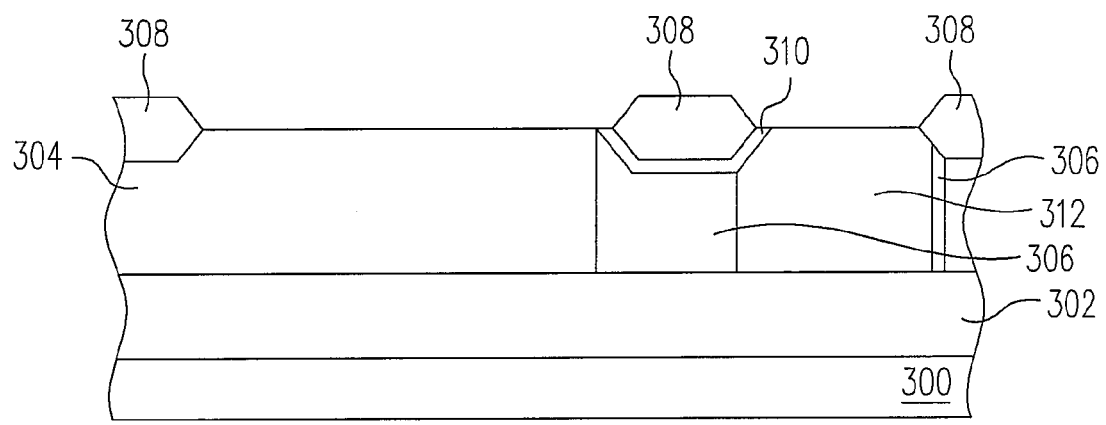

As shown in FIG. 3B, an N-type well 306 is formed in the N-type epitaxial layer 304 such that the N-type well 306 and the buried N-doped region 302 are connected. The N-type well 306 is formed, for example, by performing an ion implant using phosphorus as the dopants.

Thereafter, an isolation structure 308 is formed in the N-type well 306. The isolation structure 308 is fabricated using silicon oxide, for example. The isolation structure 308 is a field oxide layer formed, for example, by performing a thermal oxidation. As anyone knowledgeable in this area may notice that any structure or material with isolating capability can be used to form the isolation structure 308 in the present invention. For example, the isolation structure 308 can be a shallow trench isolation (STI) structure.

It should be noted that the high voltage MOS structure in the present invention might selectively form an N-type drift region 310 in the N-type epitaxial layer 304 under the isolation structure 308. The N-type drift region 310 is formed, for example, by performing an ion implant process using phosphorus as the dopants. The N-type drift region 310 and the N-type well 306 can be fabricated together in the same ion implant process by adjusting the ion implant energy and dopant concentration. The N-type drift region 310 has a dopant concentration greater than the N-type well 306.

In addition, an N-type well 312 can be selectively formed in the N-type epitaxial layer 304 on that side close to the isolation structure 308 such that the N-type well 312 is connected to the buried N-doped region 302. The N-type well 306 is formed, for example, by performing an ion implant process using phosphorus as the dopants. The N-type well 312 has a dopant concentration greater than the N-type drift region 310.

Figure 3C:
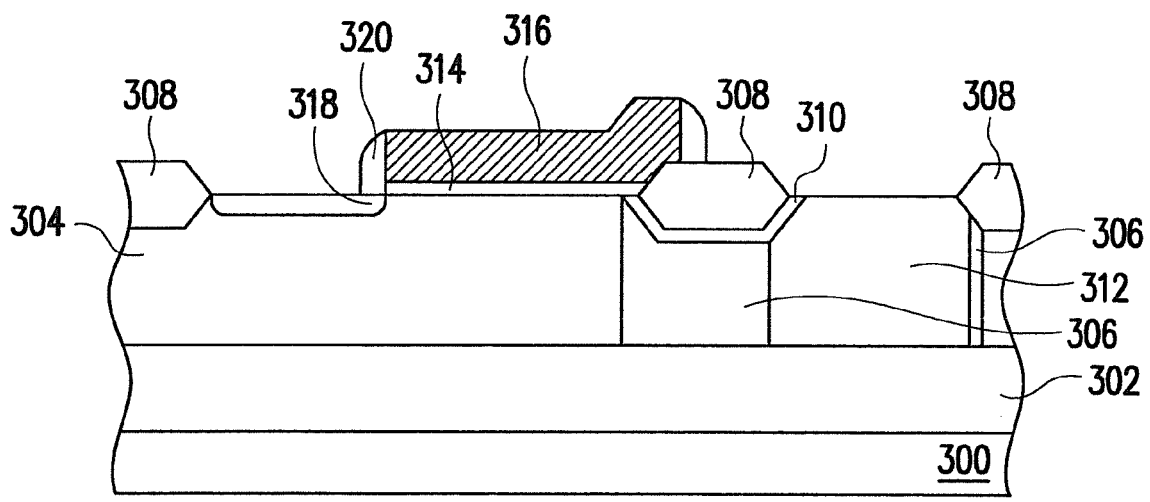

As shown in FIG. 3C, a gate dielectric layer 314 is formed over the N-type epitaxial layer 304. The gate dielectric layer 314 is fabricated using silicon oxide, for example. The gate dielectric layer is formed, for example, by performing a thermal oxidation.

Thereafter, a gate 316 is formed over the gate dielectric layer 314 and a portion of the isolation structure 308. The gate 316 is fabricated using doped polysilicon, for example. The gate 316 is formed, for example, by performing a chemical vapor deposition process with in-situ doping and performing a photolithographic and etching process thereafter.

Furthermore, an N-type source extension region 318 can also be formed in the N-type epitaxial layer 304 on that side of the gate 316 away from the isolation structure 308. The N-type source extension region 318 is formed, for example, by performing an ion implant process using phosphorus as the dopants.

Thereafter, spacers 320 are formed on the sidewalls of the gate 316. The spacers 320 are fabricated using silicon nitride, for example. The spacers 320 are formed, for example, by forming a spacer material layer (not shown) over the substrate and performing an etching back operation thereafter.

Figure 3D:
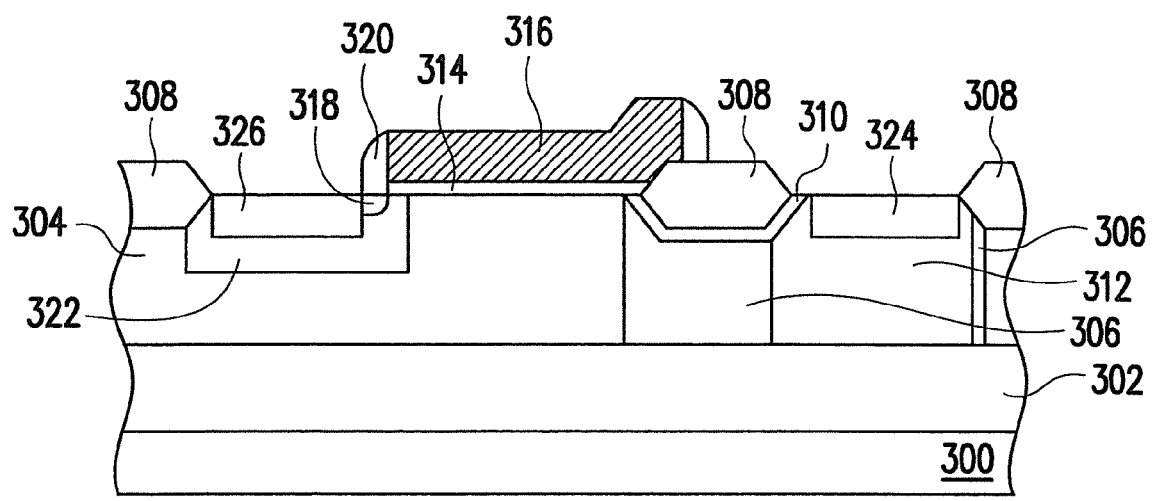

As shown in FIG. 3D, a P-type well 322 is formed in the N-type epitaxial layer 304 on that side of the gate 316 away from the isolation structure 308 and under a portion of the gate 316. The P-type well 322 is formed, for example, by performing an ion implant process using boron as the dopants. Although the P-type well 322 is formed after the gate 316, anyone familiar with the knowledge in this technical area may easily infer than the P-type well 322 can be formed before the gate 316.

Thereafter, an N-type drain region 324 is formed in the N-type epitaxial layer 304 on that side of the gate 316 close to the isolation structure 308 and an N-type source region 326 is formed in the P-type well 322. The N-type well 312 and the N-type drain region 324 have some overlapping area. The N-type drain region 324 and the N-type source region 326 are formed, for example, by performing an ion implant process using phosphorus as the dopants.

The aforesaid method of forming the high voltage MOS device can be combined with the existing BCD process. Hence, additional photomask is not required to fabricate the high voltage MOS device of the present invention.

Figure 4:
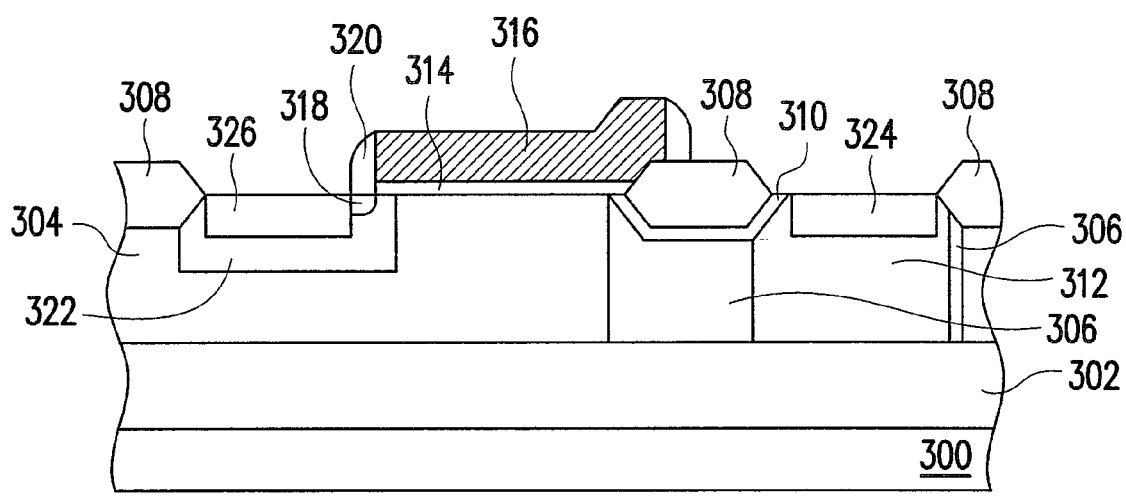
FIG. 4 is a schematic cross-sectional view of a high voltage MOS device according to one preferred embodiment of the present invention.
Figure 4A:
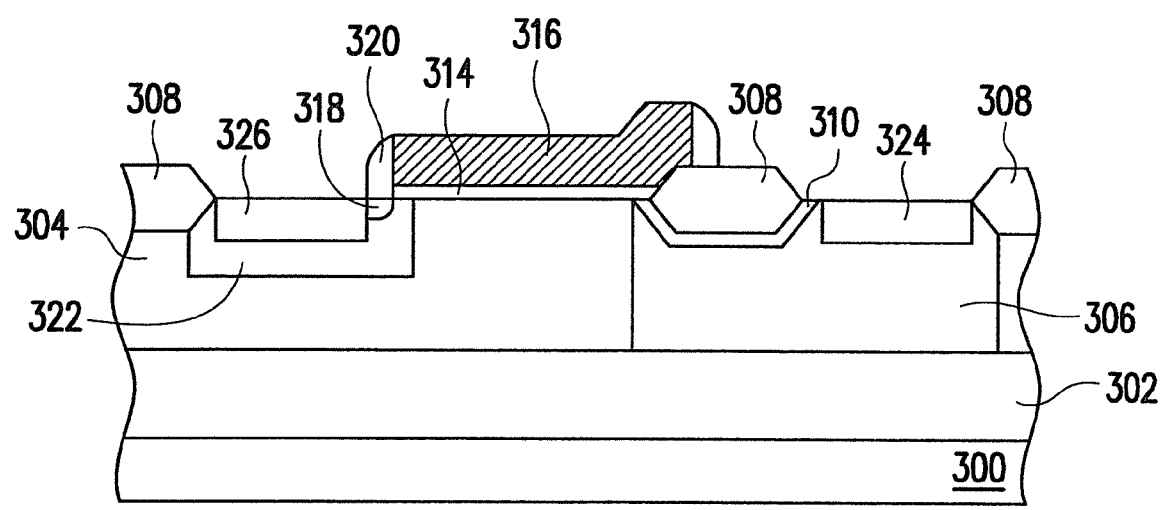
Figure 4B:
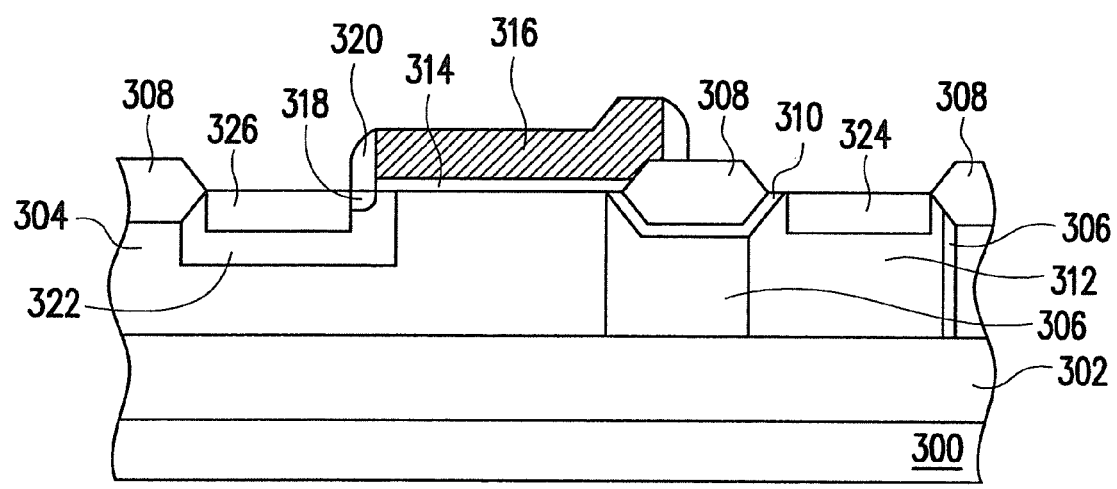

FIG. 4 is a schematic cross-sectional view of a high voltage MOS device according to one preferred embodiment of the present invention. As shown in FIG. 4, the high voltage MOS device in the present invention comprises a substrate 300, a buried N-doped region 302, an N-type epitaxial layer 304, an N-type well 306, an isolation structure 308, a gate dielectric layer 314, a gate 316, a P-type well 322, an N-type drain region 324 and an N-type source region 326. The N-type epitaxial layer 304 is disposed on the substrate 300. The isolation structure 308 is disposed in the N-type epitaxial layer 304. The gate dielectric layer 314 is disposed on the N-type epitaxial layer 304 adjacent to the isolation structure 308. The gate 316 is disposed on the gate dielectric layer 314 and a portion of the isolation structure 308. The N-type drain region 324 is disposed in the N-type epitaxial layer 304 on that side of the gate 316 close to the isolation structure 308. The P-type well 322 is disposed in the N-type epitaxial layer 304 on the other side of the gate 316. The N-type source region 326 is disposed in the P-type well 322. The N-type well 306 is disposed under the isolation structure 308 and in the N-type epitaxial layer 304 on one side of the gate 316. Furthermore, the N-type well 306 and the N-type drain region 324 have some overlapping area. The buried N-doped region 302 is disposed in the substrate 300 under the N-type epitaxial layer 304 and connected to the N-type well 306.

It should be noted that an additional N-type drift region 310 might be disposed in the N-type epitaxial layer 304 under the isolation structure 308. The N-type drift region 310 has a dopant concentration greater than the N-type well 306.

In addition, an N-type well 312 may also be disposed in the N-type epitaxial layer 304 on that side of the gate 316 close to the isolation structure 308 such that the N-type well 312 is connected to the buried N-doped region 302. The N-type well 312 and the N-type drain region 324 have some overlapping area. The N-type well 312 has a dopant concentration greater than the N-type drift region 310.

In one preferred embodiment, an N-type source extension region 318 may also be disposed in the N-type epitaxial layer 304 on that side of the gate 316 away from the isolation structure 308 and spacers 320 may be disposed on the sidewalls of the gate 316.

Because the material of various film layers and their method of fabrication as well as the method of fabricating various doped regions have already been described, another detailed description is omitted here.

Because the high voltage MOS device in the present invention includes a variety of N-type regions such as the buried N-doped region 302, the N-type well 306, the N-type drift region 310, the N-type well 312 each with a different dopant concentration, the breakdown voltage of the device is increased. In addition, the buried N-doped region 302 and various other N-doped regions with different dopant concentration can provide the electric charges with more flow paths so that the overall on-resistance is reduced.

In summary, the major merits of the present invention at least includes:

1. The method used for fabricating the high voltage MOS device can combine with the existing BCD process so that no additional mask has to be manufactured. Hence, the high voltage MOS device of the present invention incurs no addition cost.

2. In the presence of the buried N-doped region and the various N-type regions with different dopant concentration, the breakdown voltage of the high voltage MOS device is increased.

3. Furthermore, the presence of the buried N-doped region and the various N-type regions with different dopant concentration also provides electric charges with more flow paths so that the on-resistance of the device is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A high voltage metal oxide semiconductor (MOS) device, comprising:

a substrate;

an N-type epitaxial layer disposed on the substrate;

an isolation structure disposed in the N-type epitaxial layer;

a gate dielectric layer disposed on the N-type epitaxial layer and adjacent to the isolation structure;

a gate disposed on the gate dielectric layer and a portion of the isolation structure;

an N-type drain region disposed in the N-type epitaxial layer on that side of the gate close to the isolation structure;

a P-type well disposed in the N-type epitaxial layer on another side of the gate;

an N-type source region disposed in the P-type well;

a first N-type well disposed under the isolation structure and in the N-type epitaxial layer on one side of the gate;

a buried N-doped region disposed in the substrate under the N-type epitaxial layer and directly and physically contacted to the first N-type well; and a second N-type well disposed in the N-type epitaxial layer on that side of the gate close to the isolation structure and connected to the buried N-doped region, and the second N-type well and the N-type drain region have some overlapping area.

2. The high voltage MOS device of claim 1, wherein the MOS device further includes an N-type drift region disposed in the N-type epitaxial layer under the isolation structure.

3. The high voltage MOS device of claim 2, wherein the N-type drift region has a dopant concentration greater than the first N-type well.

4. The high voltage MOS device of claim 1, wherein the second N-type well has a dopant concentration greater than the N-type drift region and the N-type drift region has a dopant concentration greater than the first N-type well.

5. The high voltage MOS device of claim 1, wherein the MOS device further includes a second N-type well disposed in the N-type epitaxial layer on that side of the gate close to the isolation structure and connected to the buried N-doped region, and the second N-type well and the N-type drain region have some overlapping area.

6. The high voltage MOS device of claim 5, wherein the second N-type well has a dopant concentration greater than the first N-type well.

7. The high voltage MOS device of claim 5, wherein the isolation structure includes a field oxide layer.

8. The high voltage MOS device of claim 1, wherein the first N-type well and the N-type drain region have some overlapping area.

* * * * *